United States Patent
Stoiber

(10) Patent No.: US 7,496,868 B1
(45) Date of Patent: Feb. 24, 2009

(54) METHOD AND SYSTEM FOR AUTOMATED SCHEMATIC DIAGRAM CONVERSION TO SUPPORT SEMICONDUCTOR BODY BIAS DESIGNS

(75) Inventor: Steven T. Stoiber, Los Altos, CA (US)

(73) Assignee: Transmeta Corporation, Santa Clara, CA (US)

( * ) Notice: Subject to any disclaimer, the term of this patent is extended or adjusted under 35 U.S.C. 154(b) by 151 days.

(21) Appl. No.: 10/964,448

(22) Filed: Oct. 12, 2004

(51) Int. Cl.
    *G06F 17/50* (2006.01)
(52) U.S. Cl. ............................................. 716/3; 716/5
(58) Field of Classification Search .................. 716/2–5
    See application file for complete search history.

(56) References Cited

U.S. PATENT DOCUMENTS

| | | | |
|---|---|---|---|
| 6,272,666 B1 * | 8/2001 | Borkar et al. | 716/5 |
| 6,385,761 B1 * | 5/2002 | Breid | 716/8 |
| 6,470,482 B1 * | 10/2002 | Rostoker et al. | 716/6 |
| 6,530,068 B1 * | 3/2003 | Cao et al. | 716/8 |
| 6,609,227 B2 * | 8/2003 | Bradley et al. | 716/1 |
| 6,782,516 B2 * | 8/2004 | Rittman et al. | 716/4 |
| 6,861,374 B2 | 3/2005 | Oyamatsu | |
| 6,875,665 B2 | 4/2005 | Hokazono et al. | |
| 6,877,144 B1 * | 4/2005 | Rittman et al. | 716/10 |
| 6,907,587 B2 * | 6/2005 | Rittman et al. | 716/5 |
| 6,918,100 B2 * | 7/2005 | Kresh et al. | 716/4 |
| 6,928,626 B1 * | 8/2005 | McGaughy et al. | 716/1 |
| 7,051,295 B2 * | 5/2006 | Narendra et al. | 716/2 |
| 2002/0038446 A1 * | 3/2002 | Ioudovski | 716/3 |
| 2004/0128631 A1 * | 7/2004 | Ditzel et al. | 716/2 |
| 2004/0143808 A1 * | 7/2004 | Hegde et al. | 716/11 |
| 2005/0028113 A1 * | 2/2005 | Lin et al. | 716/3 |
| 2005/0097496 A1 * | 5/2005 | Koike et al. | 716/13 |

* cited by examiner

*Primary Examiner*—Stacy A Whitmore

(57) ABSTRACT

A computer implemented method and system for converting schematic diagrams. The method includes accessing a first set of schematic diagrams, wherein the schematic diagrams represent an integrated circuit design to be realized in physical form. A plurality of a first type of circuit elements in the first set are converted into a second type of circuit elements. The conversion is implemented in accordance with a set of conversion rules. A second set of schematic diagrams representing the integrated circuit design and including the second type of circuit elements are then output.

19 Claims, 7 Drawing Sheets

METHOD AND SYSTEM FOR AUTOMATED SCHEMATIC DIAGRAM CONVERSION TO SUPPORT SEMICONDUCTOR BODY BIAS DESIGNS

TECHNICAL FIELD

Embodiments of the present invention relate to body biasing circuits for providing operational voltages in integrated circuit devices.

BACKGROUND ART

As the operating voltages for CMOS transistor circuits have decreased, variations in the threshold voltages for the transistors have become more significant. Although low operating voltages offer the potential for reduced power consumption and higher operating speeds, threshold voltage variations due to process and environmental variables often prevent optimum efficiency and performance from being achieved. Body-biasing is a prior art mechanism for compensating for threshold voltage variations, and functions by introducing a reverse bias potential between the bulk and the source of the transistor, allowing the threshold voltage of the transistor to be adjusted electrically. The application of body-biasing techniques to an existing semiconductor device may require schematic edits because the schematics may have been drawn assuming implicit and static electrical connections on the bulk nodes. Alternatively it may be desirable to have the same schematics be targeted both for non body-biasing and body-biasing techniques.

DISCLOSURE OF THE INVENTION

Embodiments of the present invention provide a method and system for automated schematic diagram conversion to support semiconductor body bias designs.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE EMBODIMENTS

Figure 1:
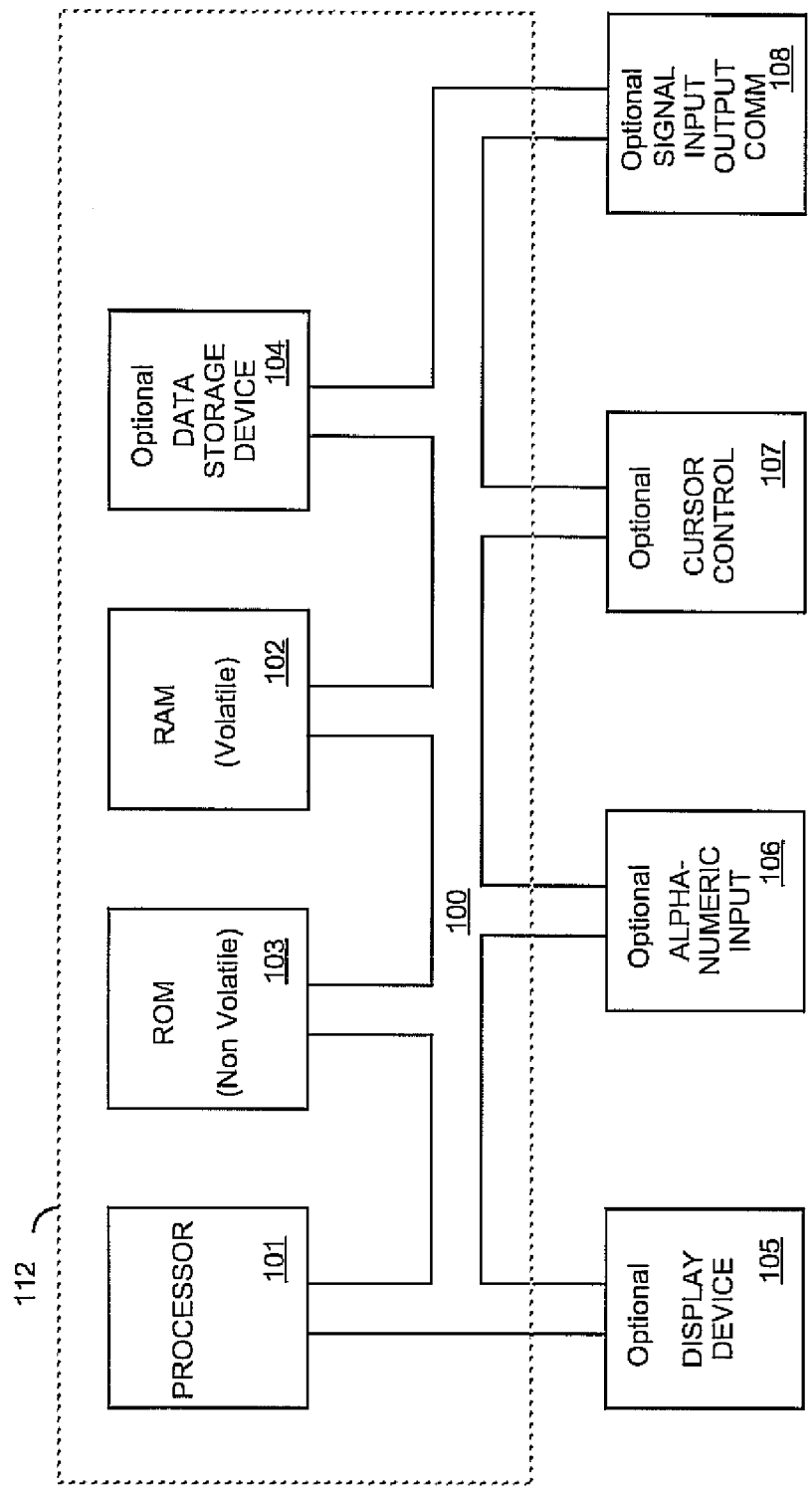
FIG. 1 shows a computer system in accordance with one embodiment of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Notation and Nomenclature:

Some portions of the detailed descriptions which follow are presented in terms of procedures, steps, logic blocks, processing, and other symbolic representations of operations on data bits within a computer memory. These descriptions and representations are the means used by those skilled in the data processing arts to convey most effectively the substance of their work to others skilled in the art. A procedure, computer executed step, logic block, process, etc., are here, and generally, conceived to be self-consistent sequences of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "outputting" "processing," "computing," "checking," "determining," "converting," or the like, refer to the action and processes of a computer system, or similar electronic computing device, that manipulates and transforms data represented as physical (electronic) quantities within the computer system's registers and memories into other data similarly represented as physical quantities within the computer system registers or memories or other such information storage, transmission, or display devices.

Computer System Environment:

Referring to FIG. 1, a computer system 112 is illustrated. Within the following discussions of the present invention, certain processes and steps are discussed that are realized, in one embodiment, as a series of instructions (e.g., software program) that reside within computer readable memory units of system 112 and executed by processors of system 112.

When executed, the instructions cause computer system 112 to perform specific actions and exhibit specific behavior which is described in detail to follow.

Specific aspects of the present invention are operable within a programmed computer aided design (CAD) system. A CAD system 112 operable to implement the elements of the present invention is shown in FIG. 1. In general, the CAD system 112 of the present invention includes an address/data bus 100 for communicating information, one or more central processor(s) 101 coupled with bus 100 for processing information and instructions, a computer readable volatile memory unit 102 (e.g., random access memory, static RAM, dynamic RAM, etc.) coupled with bus 100 for storing information and instructions for the central processor(s) 101, a computer readable non-volatile memory unit 103 (e.g., read only memory, programmable ROM, flash memory, EPROM, EEPROM, etc.) coupled with bus 100 for storing static information and instructions for processor(s) 101. System 112 can optionally include a mass storage computer readable data storage device 104, such as a magnetic or optical disk and disk drive coupled with bus 100 for storing information and instructions. Optionally, system 112 can also include a display device 105 coupled to bus 100 for displaying information to the computer user, an alphanumeric input device 106 including alphanumeric and function keys coupled to bus 100 for communicating information and command selections to central processor(s) 101, a cursor control device 107 coupled to bus for communicating user input information and command selections to the central processor(s) 101, and a signal input/output device 108 coupled to the bus 100 for communicating messages, command selections, data, etc., to and from processor(s) 101.

Program instructions executed by the CAD system can be stored in RAM 102, ROM 103, or the storage device 104 and, when executed in a group, can be referred to as logic blocks or procedures. It is appreciated that data produced at the various logic synthesis stages of the present invention, including representations of the different levels of abstraction of the integrated circuit design, can also be stored in RAM 102, ROM 103, or the storage device 104 as shown in FIG. 1.

The display device 105 of FIG. 1 utilized with the computer system 112 of the present invention may be a liquid crystal device, cathode ray tube, or other display device suitable for creating graphic images and alphanumeric characters recognizable to the user. The cursor control device 107 allows the computer user to signal dynamically the two dimensional movement of a visible pointer on a display screen of the display device 105. Many implementations of the cursor control device are known in the art including a trackball, mouse, joystick, or special keys on the alphanumeric input device 105 capable of signaling movement of a given direction or manner of displacement.

Embodiments of the Invention

Embodiments of the present invention provide a computer implemented method and system for converting schematic diagrams. The method includes accessing a first set of schematic diagrams (e.g., an input set of schematic diagrams), wherein the schematic diagrams represent an integrated circuit design to be realized in physical form. A plurality of a first type of circuit elements (e.g., three terminal transistors) in the first set are converted into a second type of circuit elements (e.g., four terminal transistors). The conversion is implemented in accordance with a set of conversion rules. A second set of schematic diagrams (e.g., output schematic diagrams) representing the integrated circuit design and including the four terminal transistor circuit elements are then output.

Figure 2:
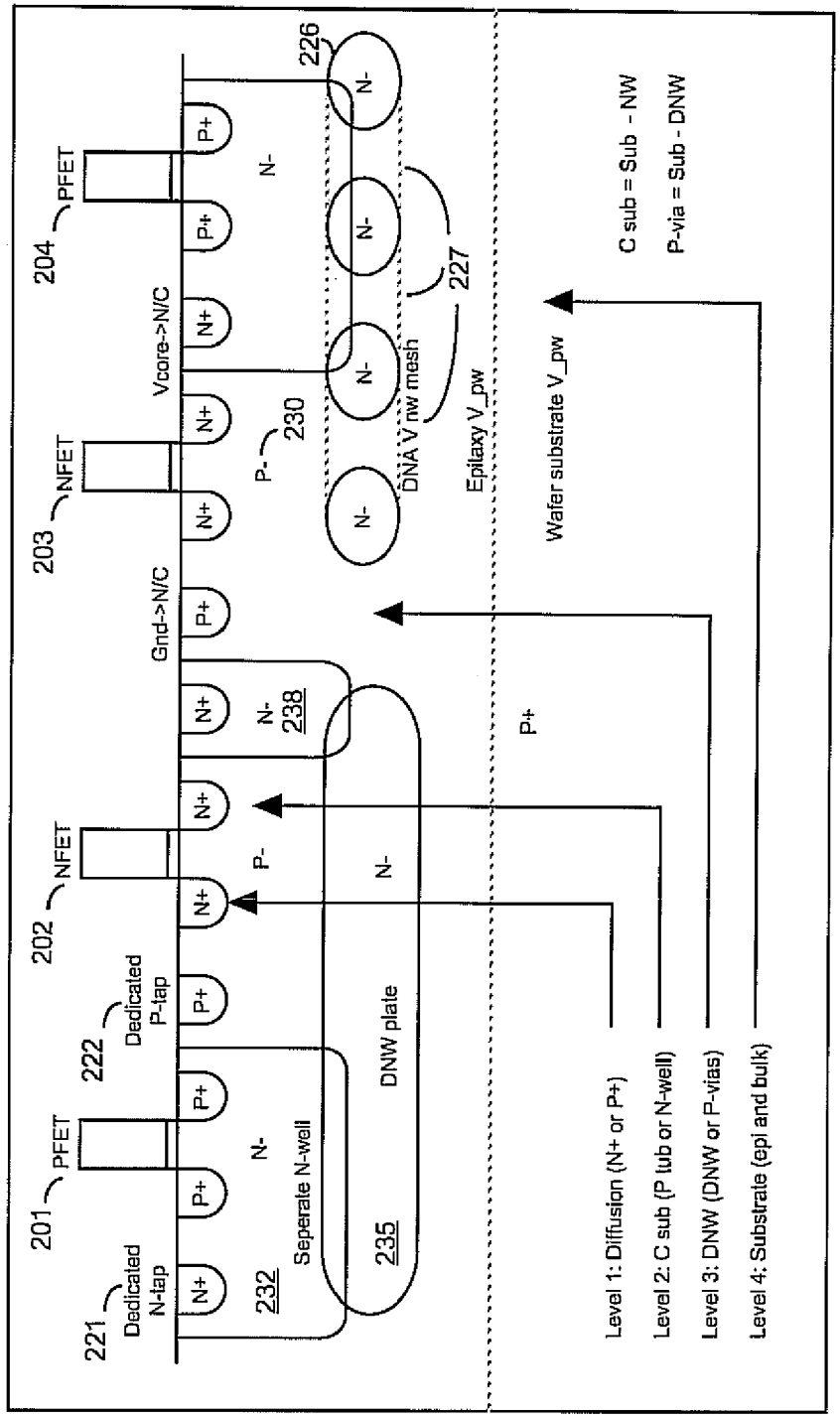
FIG. 2 shows an exemplary body biased integrated circuit device in accordance with one embodiment of the present invention.

FIG. 2 shows an exemplary integrated circuit device 200 in accordance with one embodiment of the present invention. As depicted in FIG. 2, the integrated circuit device 200 shows a plurality of connections to implement substrate body-biasing. For example, a regulation circuit (not shown) can be coupled to provide body bias currents to a PFET 201 through a dedicated bias tap 221, or to the NFET 202 through a dedicated bias tap 222.

Referring still to FIG. 2, a bias voltage distribution structure may use a deep N-well (DNW) mesh structure 226 to distribute bias voltages. The N-well bias (Vnw) may be distributed through the mesh structure 226 and the P-well bias (Vpw) may be distributed through the substrate and then up through holes 227 in the mesh structure 226 to the P-wells (e.g., P well 230). Bias-isolated Vnw regions are formed by N-wells (e.g., DNW plate 235) that are isolated from the DNW mesh structure 226 and provided dedicated N-taps (e.g., tap 221). Bias-isolated Vpw regions are formed by P-wells contained in isolated tubs (DNW floor 235, NW walls) and provided dedicated P-taps (e.g., tap 222). As shown in FIG. 2, the structures can be fabricated through different levels of ion implantation or diffusion. For example, shallow diffusion can be used to form the source and drains of the transistors, and so on, as indicated.

Figure 3:
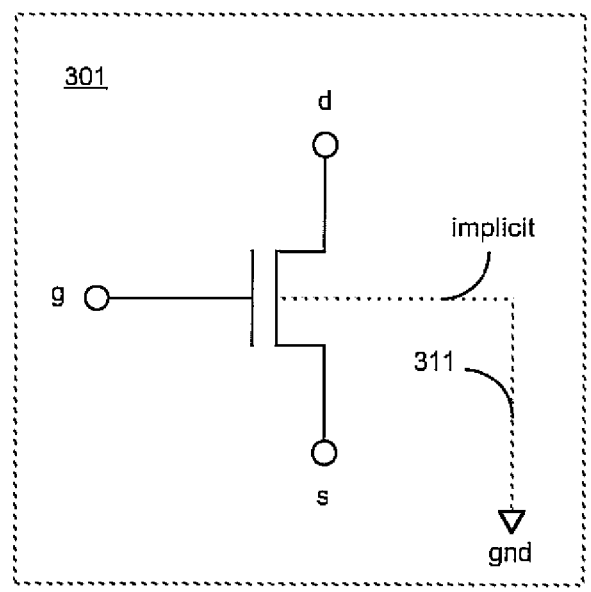
FIG. 3 shows a schematic diagram depicting an n-type transistor and a diagram illustrating a cross-section showing a physical depiction of an n-type transistor in accordance with one embodiment of the present invention.
Figure 3:
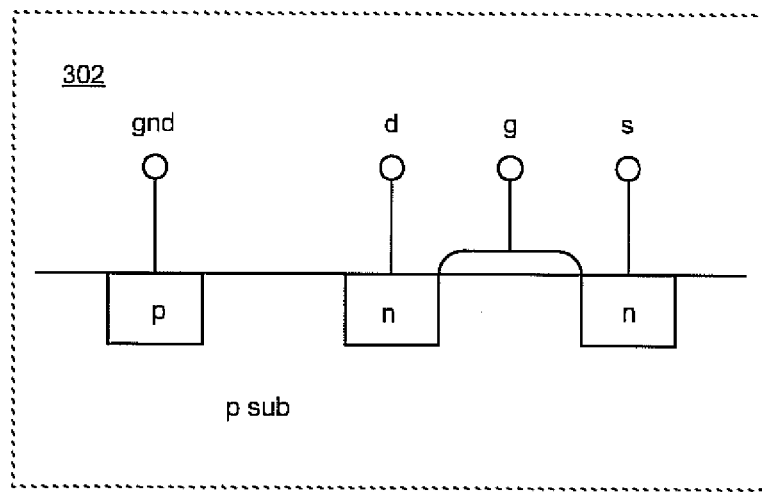

FIG. 3 shows a schematic diagram 301 depicting an n-type transistor and a diagram 302 illustrating a cross-section showing a physical depiction of an n-type transistor corresponding to the diagram 301 in accordance with one embodiment of the present invention.

As shown in FIG. 3, diagram 301 shows an n-type transistor having three terminals, a gate (g), a drain (d), and a source(s). A fourth terminal 311 exists but is typically not explicitly shown in the schematic diagram. This is due to fact that schematic diagrams are often drawn where there is an implicit bulk connection for the NFETs (N field effect transistors). The terminal 311 is shown for purposes of explanation in diagram 302. This implicit connection (e.g., terminal 311) is assumed to be ground (gnd), or otherwise the lowest voltage potential of the integrated circuit.

Figure 4:
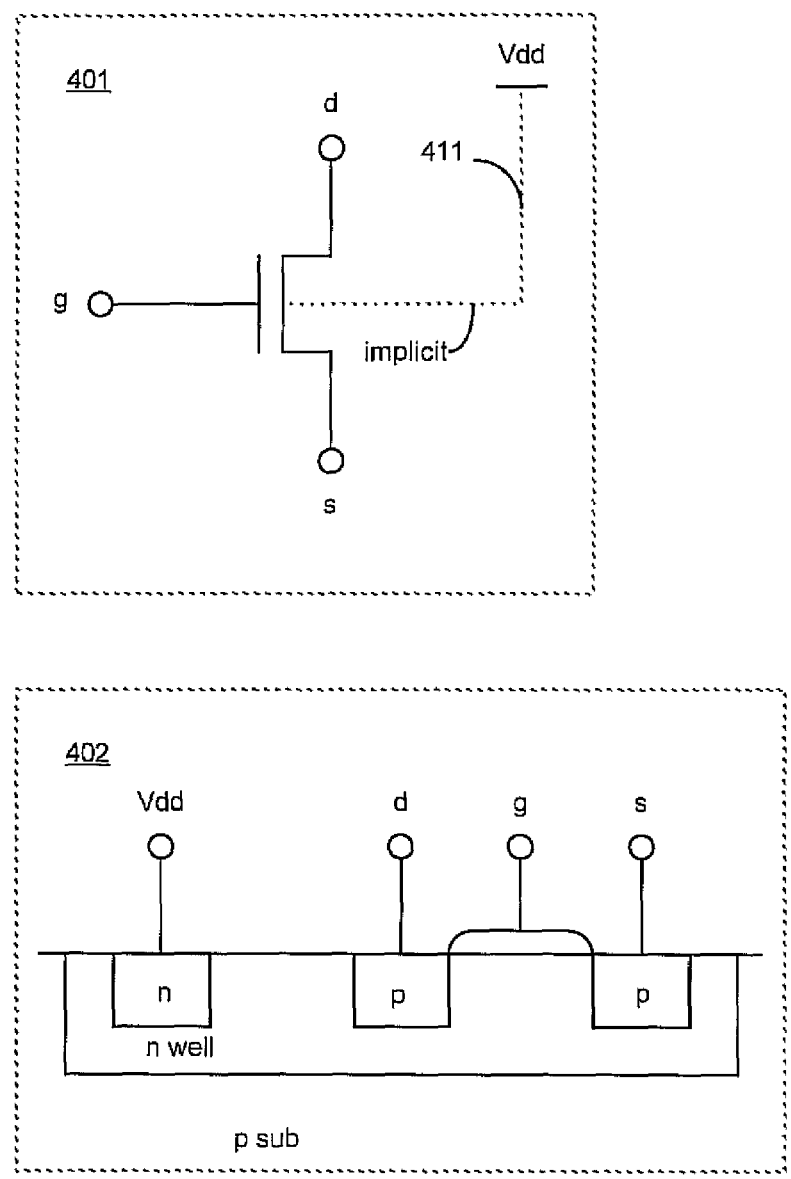
FIG. 4 shows a schematic diagram depicting a p-type transistor and a diagram illustrating a cross-section showing a physical depiction of a p-type transistor in accordance with one embodiment of the present invention.

FIG. 4 shows a schematic diagram 401 depicting a p-type transistor and a diagram 402 illustrating a cross-section showing a physical depiction of a p-type transistor corresponding to the diagram 401 in accordance with one embodiment of the present invention.

As shown in FIG. 4, for p type transistors (e.g., PFETs) the implicit connection 411, the bulk node connection, is assumed to be to the highest potential (hereafter Vdd) as opposed to the lowest potential as in NFETs.

These implicit bulk connections are typically automatically connected to the appropriate electrical nodes when the schematic diagrams are readied for downstream tools such as layout verification or circuit simulation.

There is a problem, however, in that this implicit connectivity is not compatible with newer body bias type designs (e.g., as shown in FIG. 2).

Figure 5:
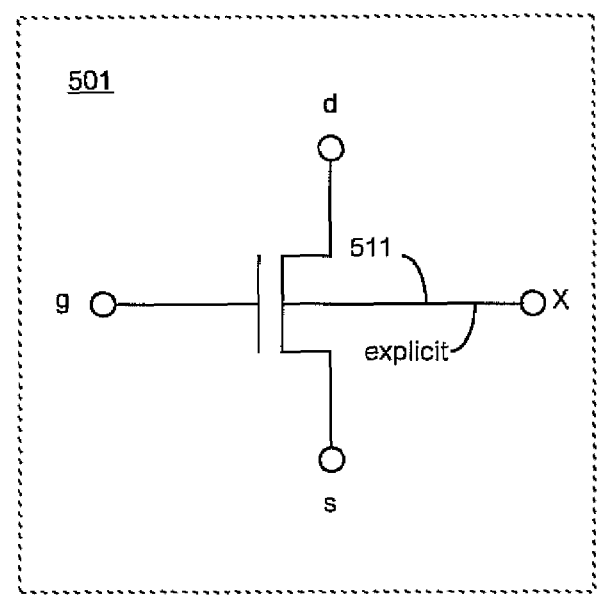
FIG. 5 shows a schematic diagram depicting a n-type transistor and a diagram illustrating a cross-section showing a physical depiction of a n-type transistor having an explicit bulk connection in accordance with one embodiment of the present invention.
Figure 5:
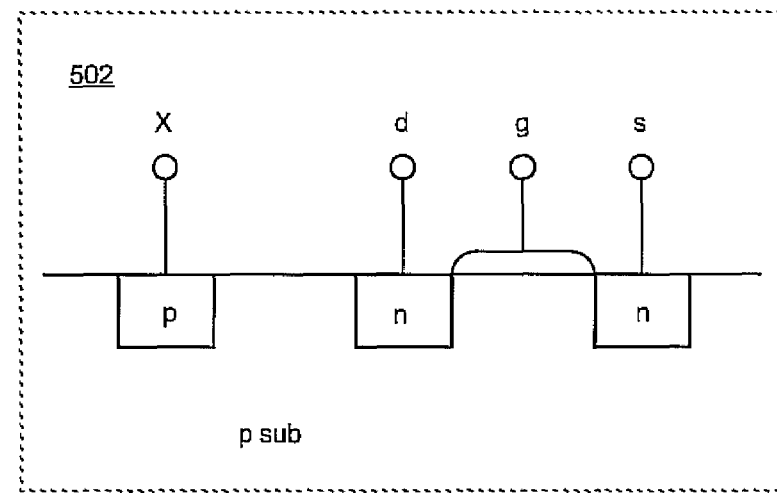

FIG. 5 shows a schematic diagram 501 depicting a n-type transistor and a diagram 502 illustrating a cross-section showing a physical depiction of a n-type transistor corresponding to the diagram 501 having an explicit bulk connection 511 in accordance with one embodiment of the present invention.

In a back bias modulated system, some FETs have Vdd or gnd bulk nodes whereas others have their bulk nodes electrically connected to some voltage level other than Vdd and gnd. For example, PFETs under back bias, or body bias, control might have their bulks on a node called Vnw and NFET's Vpw, in the same manner as shown in FIG. 2. This is shown in FIG. 5 for an NFET where the explicit connection 511 is explicitly shown connected to a body bias voltage X.

Figure 6:
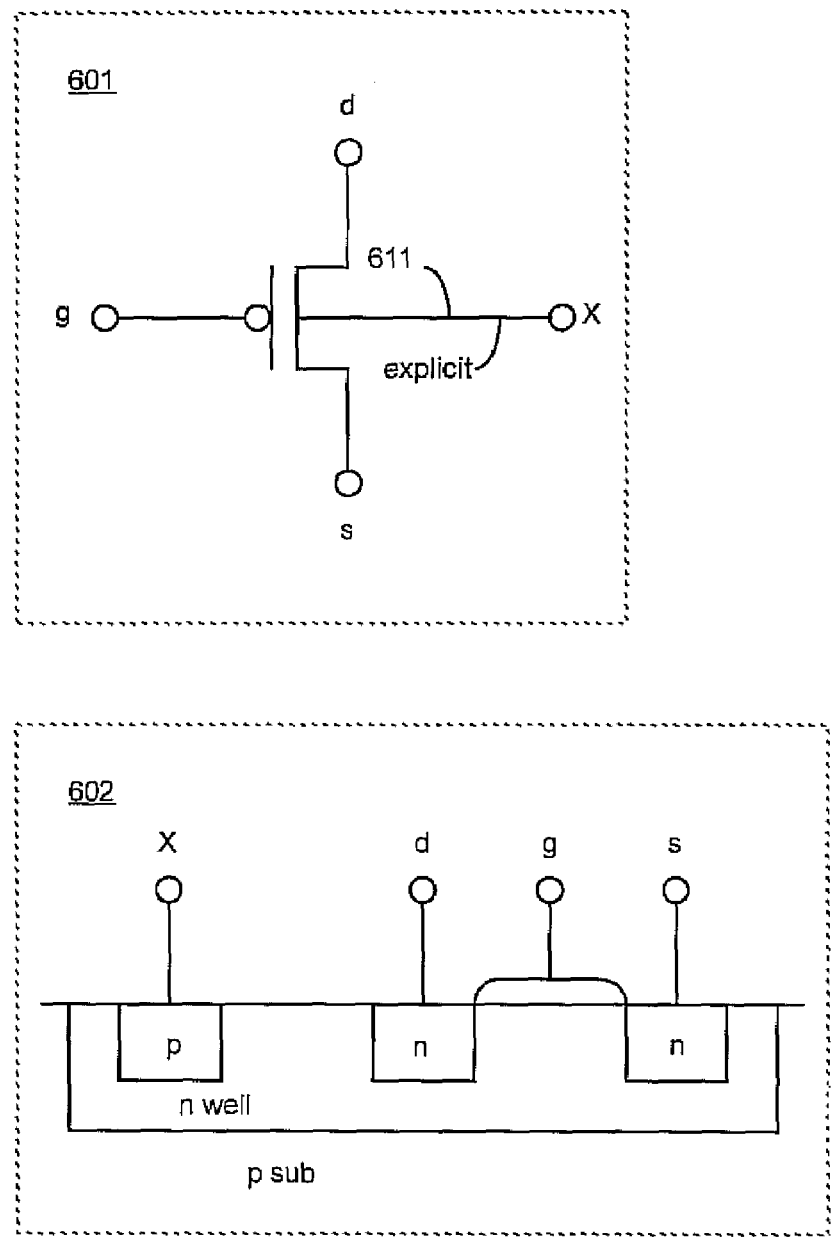
FIG. 6 shows a schematic diagram depicting a p-type transistor and a diagram illustrating a cross-section showing a physical depiction of a p-type transistor having an explicit bulk connection in accordance with one embodiment of the present invention.

FIG. 6 shows a schematic diagram 601 depicting a p-type transistor and a diagram 602 illustrating a cross-section showing a physical depiction of a p-type transistor corresponding to the diagram 601 having an explicit bulk connection 611 in accordance with one embodiment of the present invention.

As described above, in a back bias modulated system, some FETs have Vdd or gnd bulk nodes whereas others have their bulk nodes electrically connected to some voltage level other than Vdd and gnd. This is shown in FIG. 6 for a PFET where the explicit connection 611 is explicitly shown connected to a body bias voltage X in the same manner as shown in FIG. 5. In this manner, for example, PFETs under back bias, or body bias, control might have their bulks on a node X called Vnw and NFETs Vpw.

Thus, in order to make a pre-existing integrated circuit design compatible with newer back bias type fabrication technology, the lack of uniformity in the schematics with regard to bulk node connectivity must be accounted for. One solution is to manually redraw the schematics and explicitly show the bulk connections (e.g., connections 311 and 411). This, however, is not practical when trying to body bias retrofit a pre-existing integrated circuit design comprising hundreds of thousands circuit elements. Similarly, manually redrawing schematics is not practical when acquiring third-party integrated circuit designs or acquiring integrated circuit designs from different projects or vendors for incorporation into a body bias design.

Embodiments of the present invention provide a computer implemented method and system for converting schematic diagrams. The computer implemented method provides an alternative means for accomplishing the above goals. Embodiments of the present invention automatically convert schematic diagrams without explicit bulk node connectivity to schematic diagrams having explicit bulk node connectivity.

In one embodiment, the automatic conversion algorithm is based on a set of rules. The rules are as follows:

(1) A FET drawn as a three terminal device will have its bulk node connected to Vnw (if PFET) or Vpw (if NFET).

(2) A FET drawn as a four terminal device will have the bulk node connectivity left unaltered (e.g., in the same state as indicated in the input schematic diagram).

(3) Rule #1 can be overridden based on FET type. For example analog circuits may favor both thick oxide devices and isolation (Vdd or gnd bulks). In this case all thick oxide devices can then have their bulk nodes connected to Vdd or gnd even though they may have been drawn as 3 terminal devices.

(4) Rule #1 and rule #2 can be overridden for schematic sub-hierarchies by placing suitable properties on their instantiations.

(5) The precedence of rules #3 and rules #4 can be as appropriate (e.g., user defined).

The above rules will correctly convert the vast majority of the transistor circuit elements encountered in a given input schematic diagram. For those elements which are particularly problematic, or for any errors which may occur during the conversion process, a subsequent verification process can be performed on the output schematic diagrams. This verification process can optionally involve human interaction using the expertise of, for example, a circuit designer. The result of the verification process is a finalized converted schematic diagram.

Figure 7:
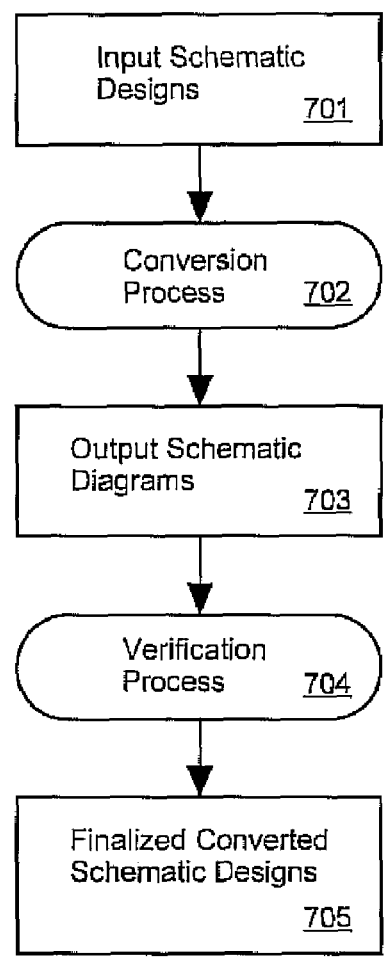
FIG. 7 shows a flowchart of the steps of a schematic diagram conversion process in accordance with one embodiment of the present invention.

FIG. 7 shows a flowchart of the steps of a process 700 in accordance with one embodiment of the present invention. As depicted FIG. 7, process 700 shows the steps involved in a schematic diagram conversion process as implemented on a computer-aided design system (e.g., system 112 of FIG. 1).

Process 700 begins in step 701, with a set of input schematic diagrams where, for p type transistors (e.g., PFETs) the implicit bulk node connection is assumed to be to the highest potential and for n-type transistors (e.g., NFETs) assumed to be the lowest potential. As described above, the input schematic diagrams can be pre-existing integrated circuit design, third-party integrated circuit designs, integrated circuit designs from differing projects or vendors, or the like, having implicit bulk node connections. In step 702, the computer implemented method executes the conversion process, whereby the input schematic diagrams are accessed, the three terminal circuit elements are recognized, and the three terminal circuit elements are converted into explicit four terminal circuit elements (e.g., having explicit bulk node connections) in accordance with the conversion rules described above. This produces output schematic diagrams as shown in step 703.

In step 704, a verification process is executed on the output schematic diagrams from the conversion process. In this step, for those elements which may be particularly problematic, or for any errors which occurred during the conversion process, the verification process isolates the elements/errors and ensures that the correct circuit elements are incorporated into the output schematic diagrams. As described above, this verification process can optionally involve human (e.g., circuit designer) interaction. Subsequently, as shown in step 705, the result of the verification process are one or more finalized converted schematic diagrams.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A computer implemented method for converting schematic diagrams, comprising:

accessing a first set of schematic diagrams, the schematic diagrams representing an integrated circuit design to be realized in physical form;

converting a plurality of a first type of circuit elements in the first set into a second type of circuit elements, the conversion automatically implemented in accordance with a set of conversion rules, and wherein said converting comprises schematically changing the number of terminals of said first type of circuit elements, and wherein said second type of circuit elements are of a type of said plurality of first type of circuit elements but represented with a different number of terminals; and outputting a second set of schematic diagrams representing the integrated circuit design and including the second type of circuit elements, wherein said second set of schematic diagrams are operable to be stored by a memory component.

2. The method of claim 1, further comprising:
performing a verification process on the second set, wherein at least one of the first type of circuit elements is converted into the second type of circuit element during the verification; and
outputting a finalized set of converted schematic diagrams.

3. The method of claim 1, wherein the first type of circuit elements are three terminal transistor elements.

4. The method of claim 1, wherein the second type of circuit elements are four terminal transistor elements.

5. The method of claim 4, wherein the four terminal transistor elements include a body bias terminal.

6. The method of claim 1, wherein the second set of schematic diagrams is configured to enable a body bias version of the integrated circuit design.

7. The method of claim 1, wherein said plurality of first type of circuit elements are a P-type transistor (PFET) represented with three terminals, and wherein said second type of circuit elements are said PFET transistor represented as a PFET with four terminals, wherein a fourth terminal of said PFET transistor couples a its bulk node to N-well bias.

8. A computer system comprising a processor coupled to a bus and a memory coupled to the bus, the memory having instructions stored there in that when executed by the processor implement a method for converting schematic diagrams, comprising:
accessing a first set of schematic diagrams, the schematic diagrams representing an integrated circuit design to be realized in physical form;
converting a plurality of a first type of circuit elements in the first set into a second type of circuit elements, the conversion automatically implemented in accordance with a set of conversion rules, and wherein said converting comprises schematically changing the number of terminals of said first type of circuit elements, and wherein said second type of circuit elements are of a type of said plurality of first type of circuit elements but represented with a different number of terminals; and
outputting a second set of schematic diagrams representing the integrated circuit design and including the second type of circuit elements.

9. The system of claim 8, further comprising:
performing a verification process on the second set, wherein at least one of the first type of circuit elements is converted into the second type of circuit element during the verification; and
outputting a finalized set of converted schematic diagrams.

10. The system of claim 8, wherein the first type of circuit elements are three terminal transistor elements.

11. The system of claim 8, wherein the second type of circuit elements are four terminal transistor elements.

12. The system of claim 11, wherein the four terminal transistor elements include a body bias terminal.

13. The system of claim 8, wherein the second set of schematic diagrams is configured to enable a body biased version of the integrated circuit design.

14. In a computer system comprising a processor coupled to a bus and a memory coupled to the bus, a computer readable memory having instructions stored there in that when executed by the processor implement a method for converting schematic diagrams, comprising:
accessing a first set of schematic diagrams, the schematic diagrams representing an integrated circuit design to be realized in physical form;
converting a plurality of a first type of circuit elements in the first set into a second type of circuit elements, the conversion automatically implemented in accordance with a set of conversion rules, and wherein said converting schematically changes the number of terminals of said first type of circuit elements, and wherein said second type of circuit elements are of a type of said plurality of first type of circuit elements but represented with a different number of terminals; and
outputting a second set of schematic diagrams representing the integrated circuit design and including the second type of circuit elements.

15. The computer readable memory of claim 14, further comprising:
performing a verification process on the second set, wherein at least one of the first type of circuit elements is converted into the second type of circuit element during the verification; and
outputting a finalized set of converted schematic diagrams.

16. The computer readable memory of claim 14, wherein the first type of circuit elements are three terminal transistor elements.

17. The computer readable memory of claim 14, wherein the second type of circuit elements are four terminal transistor elements.

18. The computer readable memory of claim 17, wherein the four terminal transistor elements include a body bias terminal.

19. The computer readable memory of claim 14, wherein the second set of schematic diagrams is configured to enable a body biased version of the integrated circuit design.

* * * * *